(12) United States Patent
Pickerd et al.

(10) Patent No.: US 11,598,805 B2
(45) Date of Patent: Mar. 7, 2023

(54) LOW FREQUENCY S-PARAMETER MEASUREMENT

(71) Applicant: Tektronix, Inc., Beaverton, OR (US)

(72) Inventors: John J. Pickerd, Hillsboro, OR (US); Kan Tan, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 300 days.

(21) Appl. No.: 16/888,443

(22) Filed: May 29, 2020

(65) Prior Publication Data
US 2020/0386809 A1  Dec. 10, 2020

Related U.S. Application Data

(60) Provisional application No. 62/858,271, filed on Jun. 6, 2019.

(51) Int. Cl.
*G01R 31/317* (2006.01)

(52) U.S. Cl.
CPC .............................. *G01R 31/31708* (2013.01)

(58) Field of Classification Search
None
See application file for complete search history.

(56) References Cited

U.S. PATENT DOCUMENTS

| | | | |
|---|---|---|---|
| 8,706,433 B2* | 4/2014 | Pupalaikis | G01R 27/32 702/66 |
| 9,772,391 B2* | 9/2017 | Pickerd | G01R 35/00 |
| 10,862,717 B2* | 12/2020 | Tan | G01R 27/32 |
| 2012/0084036 A1* | 4/2012 | Booman | G01R 1/06766 702/79 |
| 2015/0084656 A1* | 3/2015 | Pickerd | G01R 31/31924 324/750.01 |
| 2015/0212185 A1* | 7/2015 | Pickerd | G01R 1/067 324/750.02 |
| 2015/0309101 A1* | 10/2015 | Ballo | G01R 23/20 324/614 |
| 2016/0018450 A1* | 1/2016 | Tan | G01R 27/28 702/69 |
| 2017/0016953 A1* | 1/2017 | Beer | G01R 31/2837 |
| 2020/0341052 A1* | 10/2020 | Barthel | G01R 13/0218 |

* cited by examiner

*Primary Examiner* — Jermele M Hollington
(74) *Attorney, Agent, or Firm* — Miller Nash LLP; Andrew J. Harrington

(57) ABSTRACT

A method determines scattering parameters, S-parameters, for a device under test for a first frequency range. The method includes receiving S-parameters for the device under test for a second frequency range, the second frequency range greater than the first frequency range. Generally, the S-parameters for the device under test for the second frequency range can be determined using known methods. The method further includes measuring an actual response of the device under test, determining a desired signal of the device under test, and determining the S-parameters for the device under test for the first frequency range based the S-parameters for the second frequency range, actual response of the device under test and the desired signal of the device under test.

20 Claims, 6 Drawing Sheets

LOW FREQUENCY S-PARAMETER MEASUREMENT

PRIORITY

This disclosure claims benefit of U.S. Provisional Application No. 62/858,271, titled "LOW FREQUENCY S-PARAMETER MEASUREMENT AND ESTIMATION," filed on Jun. 6, 2019, which is incorporated herein by reference in its entirety.

TECHNICAL FIELD

This disclosure is directed to systems and methods related to test and measurement systems, and in particular, to characterizing the performance of a test and measurement probe for a test and measurement system.

BACKGROUND

A set of scattering parameters (S-parameters) of a device under test, such as a probe, can be measured, for example, by a vector network analyzer (VNA), in the frequency range of f1 to f2. Typically, the lowest frequency at which the VNA can adequately measure the S-parameters is 25 MHz. Typically, the probe is attached to a fixture when measuring the S-parameters. The S-parameters of the fixture can be obtained separately, and then the S-parameters of the probe and fixture combined can be obtained. The S-parameters of the probe are determined by de-embedding the fixture from the obtained S-parameters of the fixture and the probe combined. This methodology has worked well for most probes in the frequency range of f1 to f2.

However, with the advent of an interposer for double data rate (DDR) memory measurements, a tip resistor of the probe has been moved onto the interposer circuit, which has its own set of S-parameters. The tip in the probe may have a 0.0 Ω resistor, which may result in raw probe S-parameters that have a large overshoot and long decay time on the order of 150 ns. The impedance of the probe tip can change from 50 k Ω to 50 k Ω within the span of direct current (DC), or zero Hz, to 25 MHz. Thus, the existing fixture de-embedding method does not adequately work to measure probe S-parameters in this frequency span since the resistance of the probe tip is changing at these low frequencies.

Embodiments of the disclosure address these and other deficiencies of the prior art.

BRIEF DESCRIPTION OF THE DRAWINGS

Aspects, features and advantages of embodiments of the present disclosure will become apparent from the following description of embodiments in reference to the appended drawings in which.

DESCRIPTION

Currently, as mentioned above, S-parameters for a device under test are measured using a vector network analyzer in a frequency range of f1 to f2, where f1 is not equal to zero. Vector network analyzers typically cannot measure down to DC. For probes, a typical start frequency value of f1 is 25 MHz. Embodiments of the disclosure allow for the S-parameters of the device under test to be measured from zero frequency, or direct current (DC), up to f1.

Figure 1:
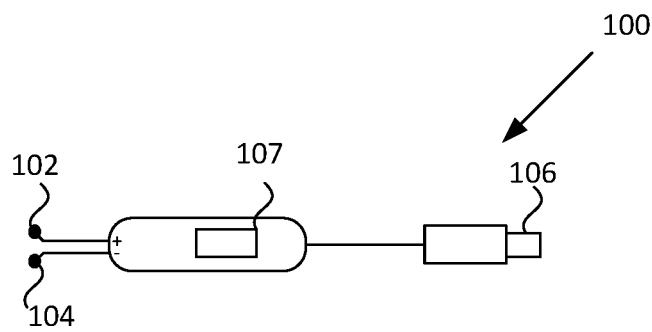
FIG. 1 is an example of a device under test.

FIG. 1 illustrates an example of a device under test 100, which is shown as a high-impedance probe, including three ports 102, 104, and 106. The S-parameters for device under test 100 are measured using known methodologies for frequencies between f1 to f2. The device under test 100 may also include a memory 107 for storing S-parameters for the device under test 100. In some embodiments, the device under test 100 can be a high impedance active probe, for example. Embodiments of the disclosure, however, are not limited to devices under tests that are probes, but can be any device under test that requires measuring S-parameters for a lower frequency range.

Figure 2:
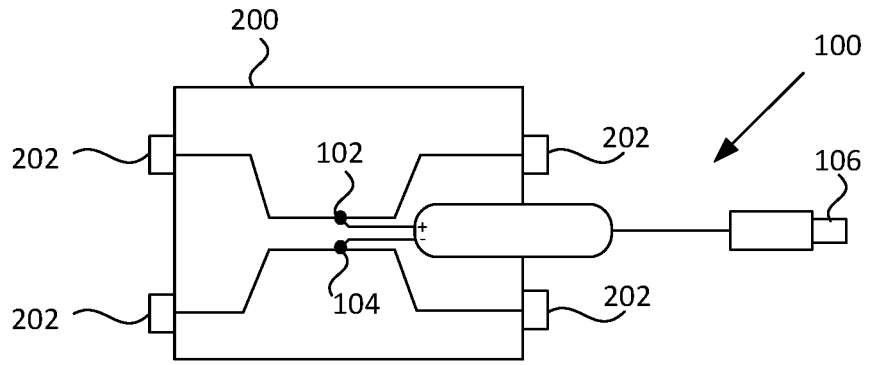
FIG. 2 is an example of the device under test of FIG. 1 connected to a fixture.

As illustrated in FIG. 2, the device under test 100 can be connected to a fixture 200. The S-parameters of the fixture 200 from f1 to f2 are measured separately, and then the S-parameters of the device under test 100 and the fixture 200 are measured together from f1 to f2. Since the S-parameters of the fixtures 200 are known, the S-parameters of the device under test 100 from f1 to f2 are obtained by de-embedding the S-parameters of the fixture 200 from the measured S-parameters of the device under test 100 and the fixture 200. The fixture 200 can have source impedance inputs 202 of 50 Ohms.

However, now with interposers for double data rate (DDR) memory measurements, a tip resistor of the probe has moved into the interposer circuit, which has its own set of S-parameters. Interposers are devices that are typically inserted between a memory integrated circuit (IC) chip and the printed circuit board that the memory IC chip normally mounts on. The interposers are small printed circuit boards or flexible circuits that sample the signals between the memory IC chip and the printed circuit board. A test and measurement instrument, such as an oscilloscope, can be connected to the interposer through a probe to measure the signals. Because the tip resistor is moved into the interposer circuit, tips 102 and 104 in the device under test 100 may have a 0.0 Ohm resistor, which can result in raw device under test S-parameter set that has a large overshoot and long decay time, such as 150 nanoseconds. The impedance of the input tips 102 and 104 change from 5 kOhms to 50 Ohms within the span of DC to f1. Thus, an existing fixture de-embedding method does not adequately measure S-parameters in this frequency span.

Figure 3:
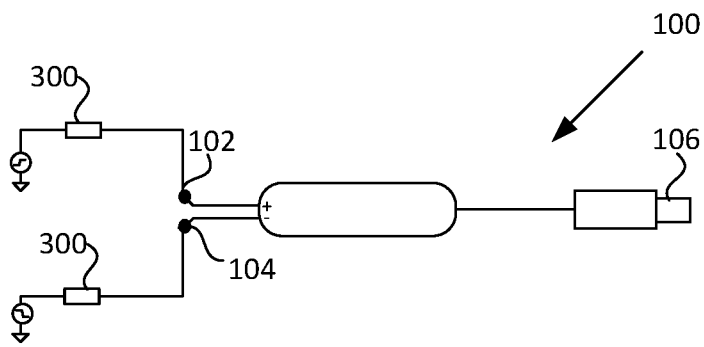
FIG. 3 is a simplified example of the device under test connected to the fixture of FIG. 2.

FIG. 3 illustrates a simplified model of a device under test 100 and a source. In this model, the ports 102 and 104 are treated as a single first differential port. Port 106 is treated as a single ended port. The source 300 impedance is 25 Ohms as seen from the device under test 100. It has been determined that the primary influencers of the step response of the device under test 100 in the frequency range of DC to f1 are the differential sd11 and differential sd21 S-parameters. Because the other S-parameters have a very small effect, they may be included in the system transfer function using simple point replication or linear extrapolation in the range of DC to f1. If they are incorporated, then the values can be used as part of the known values in the solution, discussed in further detail below, along with the pre-measured S-parameters from f1 to f2.

Figure 4:
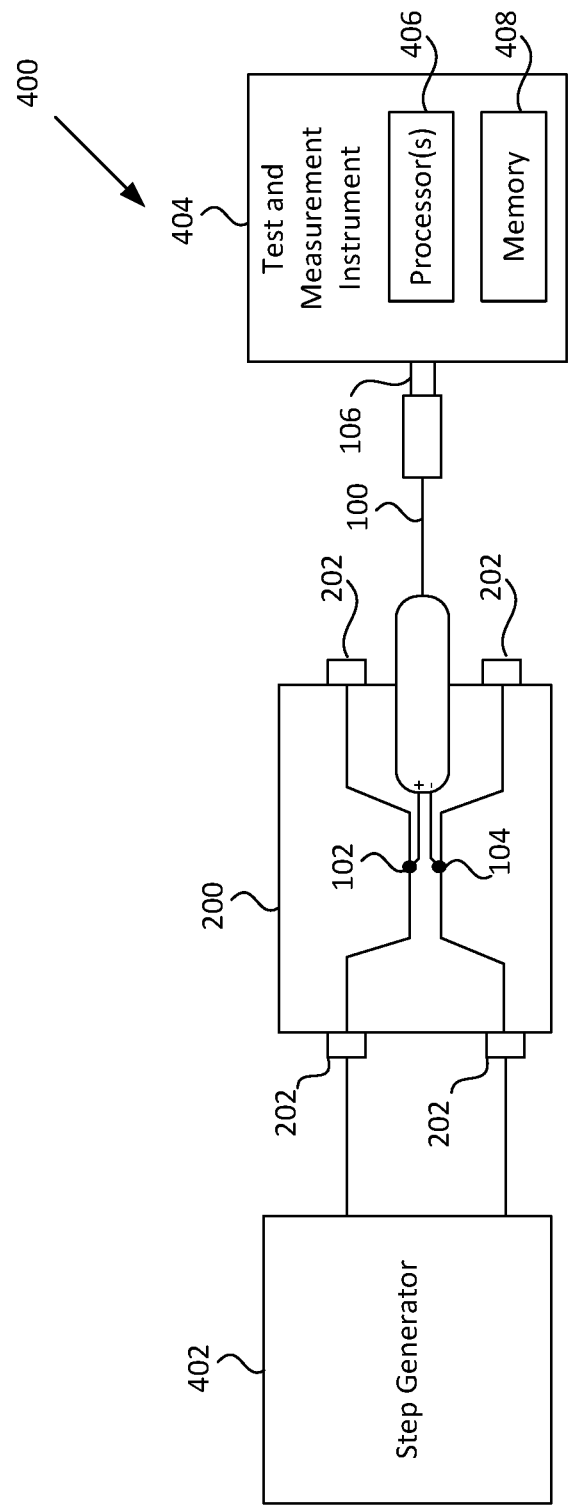
FIG. 4 is a block diagram of a test and measurement system according to some embodiments of the disclosure.

As depicted in FIG. 4, the operation for determining the S-parameters of the device under test 100 can include a test and measurement system 400 having a step generator 402 connected to the fixture 200 and the device under test 100, as well as a test and measurement instrument 404, such as an oscilloscope. The test and measurement instrument 404 can include one or more processors 406 and memories 408. In some embodiments, the test and measurement instrument 404 may determine the S-parameters of the device under test 100 from DC to f1. In other embodiments, a remote processor and other hardware may be used to determine the S-parameters of the device under test from DC to f1 based on information received from the test and measurement instrument 404. As such, although embodiments below discuss the use of processor 406 for ease of discussion, embodiments of the disclosure are not limited to the use of the processor 406 in the test and measurement instrument 404.

As will be discussed in more detail below, to determine sd11 and sd21 values of the device under test 100, an initial estimate or guess for sd11 can be generated based on circuit simulations, and then multiple iterations are performed switching between solving for sd21 and sd11 until a final value for each variable is found.

Figure 5:
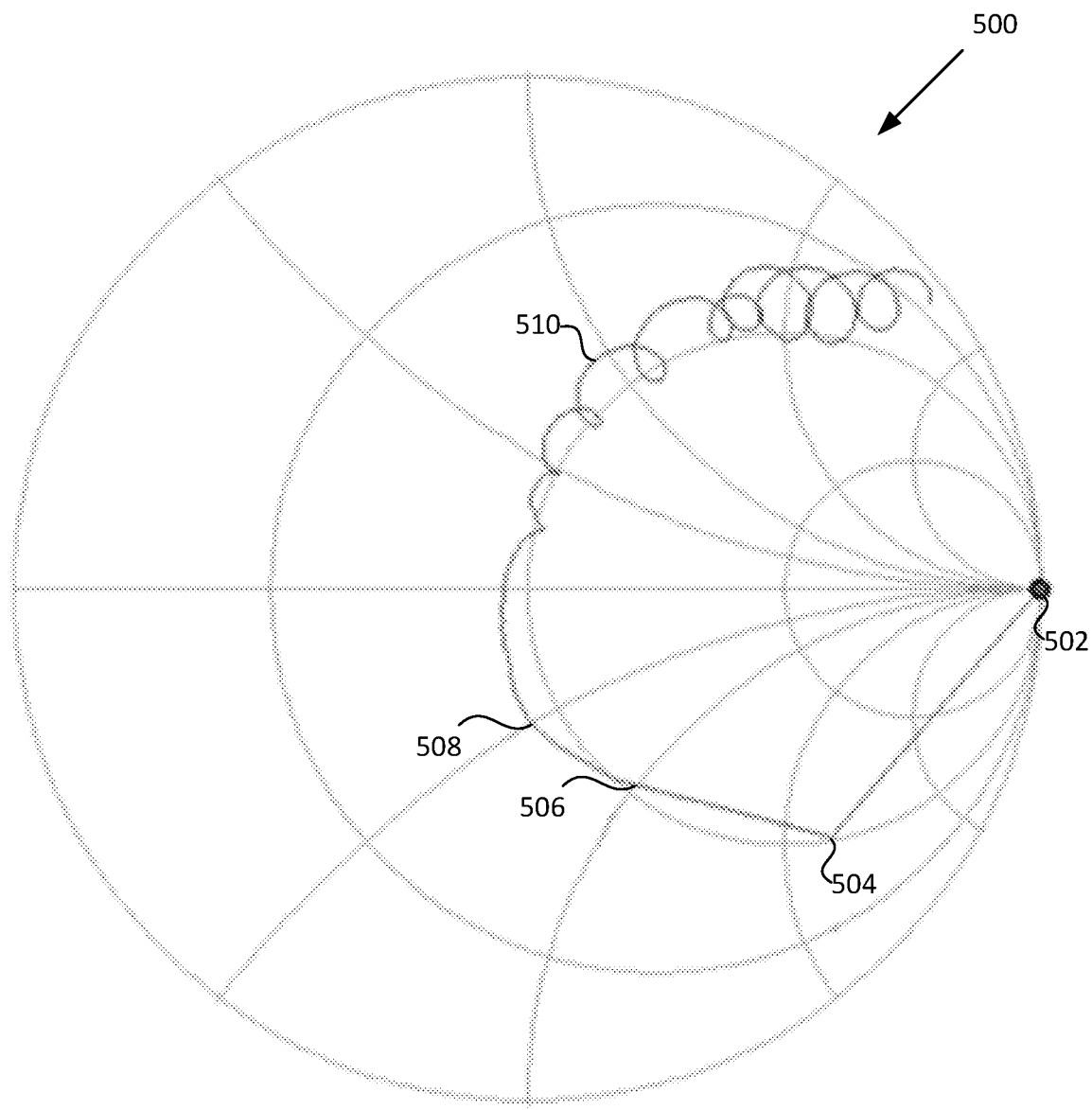
FIG. 5 is an example of a Smith chart which may be utilized by the test and measurement instrument in FIG. 4.

For example, the processor 406 may use a Smith chart, as illustrated in FIG. 5, to estimate the values of sd11 used in the initial iteration of determining the sd11 and sd21 values. FIG. 5 illustrates an example of a Smith chart 500. Points 502, 504, 506, and 508 are determined based on the measured S-parameters 510 from f1 to f2. Points 502, 504, 506, and 508 are determined by extrapolation.

To begin to determine sd11 and sd21 for the device under test 100, equation (1) illustrates the simplified device under test 100 S-parameter model for the device under test 100 illustrated in FIG. 3.

$$H = \frac{sd21}{1 - sd11 \cdot \frac{-1}{3}} \tag{1}$$

The fixture 200 is terminated at each point 202 by 50 Ohms. Thus, the impedance of the source as seen from the position of the first differential probe tip (tips 102 and 104 in FIG. 3) is 25 Ohms. This is represented as a reflection coefficient of −⅓ in equation (1). For the situation of the differential mode, the ratio is between 100 and 50 Ohms, so the reflection coefficient of the tip load is still −⅓. For example, Γ=(50−100)/(50+100), where 100 is the reference impedance for the differential situation, and the probe tip loading is 25 Ohms on one tip 102 and 25 Ohms on the other tip 104 for a total of 50 Ohms.

Figure 6:
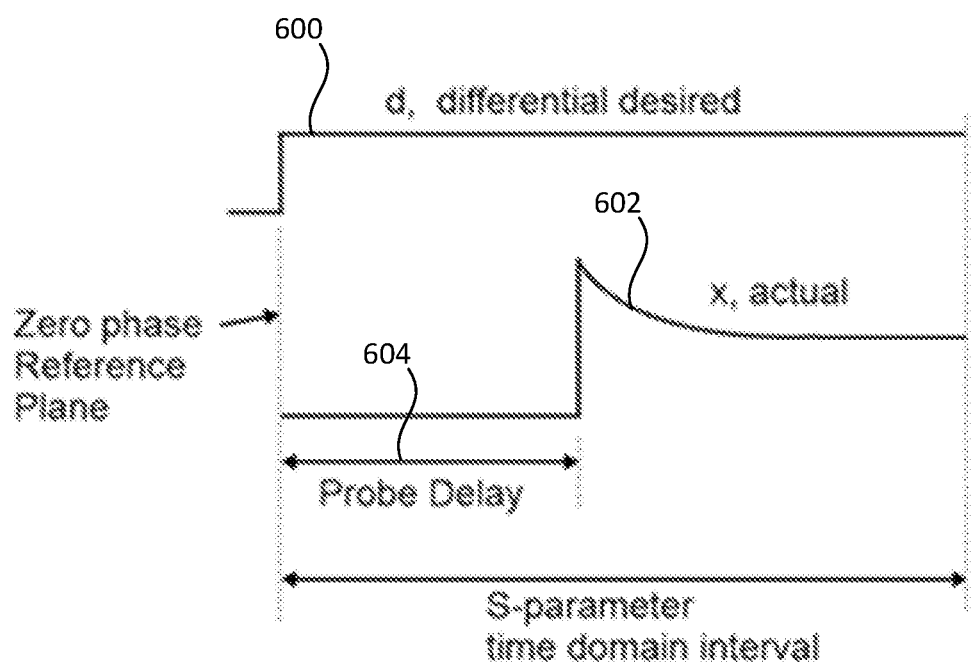
FIG. 6 is an example of time positions of a desired signal and an actual measured signal.

To determine the S-parameters sd11 and sd21, an ideal step response D, illustrated as differential desired signal 600 in FIG. 6 can be generated, which is the waveform at the device under test tip position if the device under test 100 was removed from the circuit, and compared to an acquired step response X, illustrated as the actual signal 602 in FIG. 6, through the device under test 100.

To obtain the actual signal X mathematically, the transfer function H from equation (1) is applied to the ideal signal, D, as shown in equation (2).

$$X = D \cdot H \tag{2}$$

Substituting equation (1) into equation (2) results in system equation (3):

$$X = D \cdot \frac{sd21}{1 + \frac{sd11}{3}} \tag{3}$$

Equation (3) can be rearranged from its nonlinear form into a linear form, as shown in equation (4). Equation (4) can then be used for a least means square (LMS) computation process, which is described in more detail below. In equation (4), D is generated based on what an ideal step response of the probe should be, and the actual signal X is obtained by the test and measurement instrument 404 using the test and measurement system 400 illustrated in FIG. 4.

$$C = D \cdot sd21 - \frac{X}{3} \cdot sd11 - X = 0 \tag{4}$$

The zero-phase reference of the S-parameters is at the beginning of the time domain record, which is illustrated in FIG. 6. The desired step signal 600 is positioned in time at the beginning of the time record, which is the zero-phase reference position of the device under test tip. Due to the probe delay 604, the acquired actual step signal 602 can be moved in time before solving equation (4), such that its group delay is equal to the group delay of differential sd21 of the probe. These group delays are positioned accurately to within the sub sample position because any small error will cause the final filters created from the final probe S-parameters to exhibit tilt in the step response.

Both data sets for the desired signal D 600 and the actual signal X 602 can be resampled to have the same length and frequency spacing as the measured S-parameters of the device under test from f1 to f2. The signals D and X can be transformed to the frequency domain by taking the derivative and performing a fast Fourier transform (FFT). The frequency domain is the initial domain of equation (4) as the starting point. In equations (5) and (6) below, x(t) and d(t) are the resampled step response in the time domain.

$$X(f) = fft\left(\frac{d(x(t))}{dt}\right) \tag{5}$$

$$D(f) = fft\left(\frac{d(d(t))}{dt}\right) \tag{6}$$

Equation (4) above is the system equation which will be used as the starting point for solving the unknown points of sd11 and sd21 in the frequency span of DC to f1. However, the LMS problem solution requires transforming the expression in terms of time domain samples. The inverse fast Fourier transform (IFFT) cannot be used for this because it requires all samples to be known in the frequency domain. Thus, the solution can be obtained representing the equations in terms of the inverse discrete Fourier transform (IDFT), with it factored into the known values versus the unknown values which will be solved for.

As mentioned above, the points from f1 to f2 are measured using known methods and can be stored in memory 408. The points of sd11 in the range of DC to f1 can be estimated using an equivalent model circuit as illustrated in FIG. 5. The desired signal and actual signals values are obtained by computing the derivative of and then computing the fast Fourier transform. Thus, the only unknown to be solved for in initial equation (4) are the values of sd21 from DC to f1.

The IDFT definition is shown in equation (7):

$$j = \sqrt{-1}$$

$$IDFT(m, X) = \frac{1}{N} \cdot \sum_{n=0}^{N-1} X(n-1) e^{j \cdot 2 \cdot \pi \cdot m \cdot n / N} \quad (7)$$

The exponential equation can be represented, as is common, by the W variable often referred to as the twiddle factor. It is defined according to equation (8).

$$W_{n,m} = e^{j \cdot 2 \cdot \pi \cdot m \cdot (n-1)/N} \quad (8)$$

In practice, the length, N, of X, D, sd21, and sd11 will be equal to several thousand points. To simplify and understand the organization for the solution, an eight-sample example matrix setup configuration will be used to represent performing the IDFT on the known and unknown sample points. Thus, N=8 for the ease of discussion below. However, as will be understood by one skilled in the art, in practice, N will typically be equal to several thousand points.

For the sample case, assume the first two points of C are unknown but the remaining points are known. In addition, the complex conjugate point of C(N) is also unknown. It is the complex conjugate of C(1).

The vector of the system transfer function, C, in the frequency domain is the right column vector in equation (9). Multiply C times the twiddle matrix to represent the IDFT to obtain time domain samples for the solution. The time domain representation is still equal to zero as shown in (9).

$$\begin{pmatrix} W_{0,0} & W_{0,1} & \blacksquare & \blacksquare & \blacksquare & \blacksquare & \blacksquare & W_{0,7} \\ W_{1,0} & W_{1,1} & \blacksquare & \blacksquare & \blacksquare & \blacksquare & \blacksquare & W_{1,7} \\ \blacksquare & \blacksquare & \blacksquare & \blacksquare & \blacksquare & \blacksquare & \blacksquare & \blacksquare \\ \blacksquare & \blacksquare & \blacksquare & \blacksquare & \blacksquare & \blacksquare & \blacksquare & \blacksquare \\ \blacksquare & \blacksquare & \blacksquare & \blacksquare & \blacksquare & \blacksquare & \blacksquare & \blacksquare \\ \blacksquare & \blacksquare & \blacksquare & \blacksquare & \blacksquare & \blacksquare & \blacksquare & \blacksquare \\ \blacksquare & \blacksquare & \blacksquare & \blacksquare & \blacksquare & \blacksquare & \blacksquare & \blacksquare \\ W_{7,0} & W_{7,1} & \blacksquare & \blacksquare & \blacksquare & \blacksquare & \blacksquare & W_{7,7} \end{pmatrix} \cdot \begin{bmatrix} D_0 \cdot sd21_0 - \frac{X_0}{3} \cdot sd11_0 - X_0 \\ D_1 \cdot sd21_1 - \frac{X_1}{3} \cdot sd11_1 - X_1 \\ D_2 \cdot sd21_2 - \frac{X_2}{3} \cdot sd11_2 - X_2 \\ D_3 \cdot sd21_3 - \frac{X_3}{3} \cdot sd11_3 - X_3 \\ D_4 \cdot sd21_4 - \frac{X_4}{3} \cdot sd11_4 - X_4 \\ (D_5 \cdot sd21_5) - \frac{X_5}{3} \cdot sd11_5 - X_5 \\ D_6 \cdot sd21_6 - \frac{X_6}{3} \cdot sd11_6 - X_6 \\ D_7 \cdot sd21_7 - \frac{X_7}{3} \cdot sd11_7 - X_7 \end{bmatrix} = 0 \quad (9)$$

Substitute variable C in for the system equation to obtain equation (10).

$$\begin{pmatrix} W_{0,0} & W_{0,1} & \blacksquare & \blacksquare & \blacksquare & \blacksquare & \blacksquare & W_{0,7} \\ W_{1,0} & W_{1,1} & \blacksquare & \blacksquare & \blacksquare & \blacksquare & \blacksquare & W_{1,7} \\ \blacksquare & \blacksquare & \blacksquare & \blacksquare & \blacksquare & \blacksquare & \blacksquare & \blacksquare \\ \blacksquare & \blacksquare & \blacksquare & \blacksquare & \blacksquare & \blacksquare & \blacksquare & \blacksquare \\ \blacksquare & \blacksquare & \blacksquare & \blacksquare & \blacksquare & \blacksquare & \blacksquare & \blacksquare \\ \blacksquare & \blacksquare & \blacksquare & \blacksquare & \blacksquare & \blacksquare & \blacksquare & \blacksquare \\ \blacksquare & \blacksquare & \blacksquare & \blacksquare & \blacksquare & \blacksquare & \blacksquare & \blacksquare \\ W_{7,0} & W_{7,1} & \blacksquare & \blacksquare & \blacksquare & \blacksquare & \blacksquare & W_{7,7} \end{pmatrix} \begin{bmatrix} C_0 \\ C_1 \\ C_2 \\ C_3 \\ C_4 \\ C_5 \\ C_6 \\ C_7 \end{bmatrix} = 0 \quad (10)$$

The frequency domain values of the system equation are presented in the column of C values, and W is equal to the matrix of twiddle values needed for the IDFT to transform to the time domain.

M is equal to the number of unknown points to solve for. In this example, M equals 2 for sd11 and sd21.

$$m := M \ldots N-M$$

Equation (10) can be refactored so that the unknown terms are on the left of the equation and the known terms are on the right side of the equation, as shown in equation (11). In equation (11), C7 is equal to the conjugate of C1.

$$\begin{pmatrix} W_{0,0} & W_{0,1} & W_{0,7} \\ W_{1,0} & W_{1,1} & W_{1,7} \\ \blacksquare & \blacksquare & \blacksquare \\ \blacksquare & \blacksquare & \blacksquare \\ \blacksquare & \blacksquare & \blacksquare \\ \blacksquare & \blacksquare & \blacksquare \\ \blacksquare & \blacksquare & \blacksquare \\ W_{7,0} & W_{7,1} & W_{7,7} \end{pmatrix} \cdot \begin{pmatrix} C_0 \\ C_1 \\ C_1 \end{pmatrix} = \begin{bmatrix} \sum_m (-W_{0,m} \cdot C_m) \\ \sum_m (-W_{1,m} \cdot C_m) \\ \sum_m (-W_{2,m} \cdot C_m) \\ \sum_m (-W_{3,m} \cdot C_m) \\ \sum_m (-W_{4,m} \cdot C_m) \\ \sum_m (-W_{5,m} \cdot C_m) \\ \sum_m (-W_{6,m} \cdot C_m) \\ \sum_m (-W_{7,m} \cdot C_m) \end{bmatrix} \quad (11)$$

Letting Y equal the known part of the IDFT vector on the right side of equation (11), results in W·C=Y.

In equation (11), the unknown variable, C(1) and the conjugate of C(1) are not independent. Therefore, to solve for C(0) and C(1), a P matrix can be created to separate out the real and imaginary parts of each. Keep in mind the variable C is the system equation which is written in terms of sd21 and sd11 along with the desired step response, D, and the actual step response, X. Once the values of C are solved for then the desired sd21 or sd11 will be computed from the values of C.

$$P = \begin{pmatrix} 1 & 0 & 0 \\ 0 & 1 & i \\ 0 & 1 & -i \end{pmatrix} L = \begin{pmatrix} \operatorname{Re}(C_0) \\ \operatorname{Re}(C_1) \\ \operatorname{Im}(C_1) \end{pmatrix} \quad (12)$$

$$W \cdot P \cdot L = Y$$

$$C = P \cdot L$$

P is the conversion matrix to convert the array of C values into an equivalent length array of real and imaginary parts of the unknown values to be solved for.

Let:

$$U = W \cdot P \quad (13)$$

Substitute (13) into (12):

$$U \cdot L = Y \quad (14)$$

The LMS solution for (14) is:

$$\overline{U^T} \cdot U \cdot L = \overline{U^T} \cdot Y \quad (15)$$

$$L = [\overline{U^T} \cdot U]^{-1} \cdot \overline{U^T} \cdot Y \quad (16)$$

The vector L in equation (16) contains the real and the imaginary parts of unknown values of C that were solved for.

The next step is to recombine the real and imaginary parts of L back into the locations of C and extract the unknown value. For the first iteration, estimated values of sd11 are used, so the values of sd21 can be extracted out of L. Once sd21 is extracted, then those values are used during the next iteration to extract sd11. That is, sd21 is extracted during odd numbered passes and sd11 is extracted during even number passes, as will be discussed in more detail below.

To extract sd21 during odd numbered passes, equation (17) is used:

$$sd21 = \left(C + X \cdot \frac{sd11}{3} + X\right)/D \quad (17)$$

For even numbered passes, sd11 can be extracted using equation (18):

$$sd11 = -3 \cdot (C + X - D \cdot sd21)/X \quad (18)$$

The originally measured points of sd11 and sd21 from f1 to f2 of the probe never change during the iterations. However, after each pass, the value of sd11 or sd21 is updated from DC to f1.

Once the final sd11 and sd21 values are determined, then the values can be converted back into their single-ended values for s32 and s31 of the three-port device under test. Equation (19) shows the mixed mode derivation, Sm, in terms of single ended S-parameters.

$$Sm = \begin{pmatrix} \frac{s11 - s12 - s21 + s22}{2} & s11 + s12 - s21 - s22 & s13 - s23 \\ \frac{s11 - s12 + s21 - 1.0 \cdot s22}{4} & \frac{s11 + s12 + s21 + s22}{2} & \frac{s13 + s23}{2} \\ \frac{s31 - s32}{2} & s31 + s32 & s33 \end{pmatrix} \quad (19)$$

At low frequencies, such as DC to f1, the device under test 100 S-parameters s31 and s32 are well matched resulting in s32 being equal to negative s31, as shown in equation (20).

$$s32 = -s31 \quad (20)$$

From the matrix above in equation (19):

$$sd21 = \left(\frac{s31 - s32}{2}\right) \quad (21)$$

Substitute equation (20) into equation (21) and solve for s31 and s32:

$$s31 = sd21 \quad (22)$$

$$s32 = -sd21 \quad (23)$$

The values of s12 and s21 for the impedance term in the upper left of equation (19) can be considered equal to zero.

Now the values for single ended s11 and s22 single ended can be found. In addition, assume s12 and s21 single ended are zero:

$$s11 = s22 \quad (24)$$

$$s21 = s12 = 0 \quad (25)$$

From the mixed mode matrix in equation (19):

$$sd11 = \frac{s11 + s22}{2} \quad (26)$$

Equation (24) can be substituted into equation (26) to solve for s11 and s22 single ended, given sd11.

$$s11 = sd11 \quad (27)$$

$$s22 = sd11 \quad (28)$$

The determined S-parameter values s11, s22, s32, and s31 can then be saved in a memory of the device under test 100, such as the memory 107 shown in FIG. 1, to be used during operation of the device under test 100.

Figure 7:
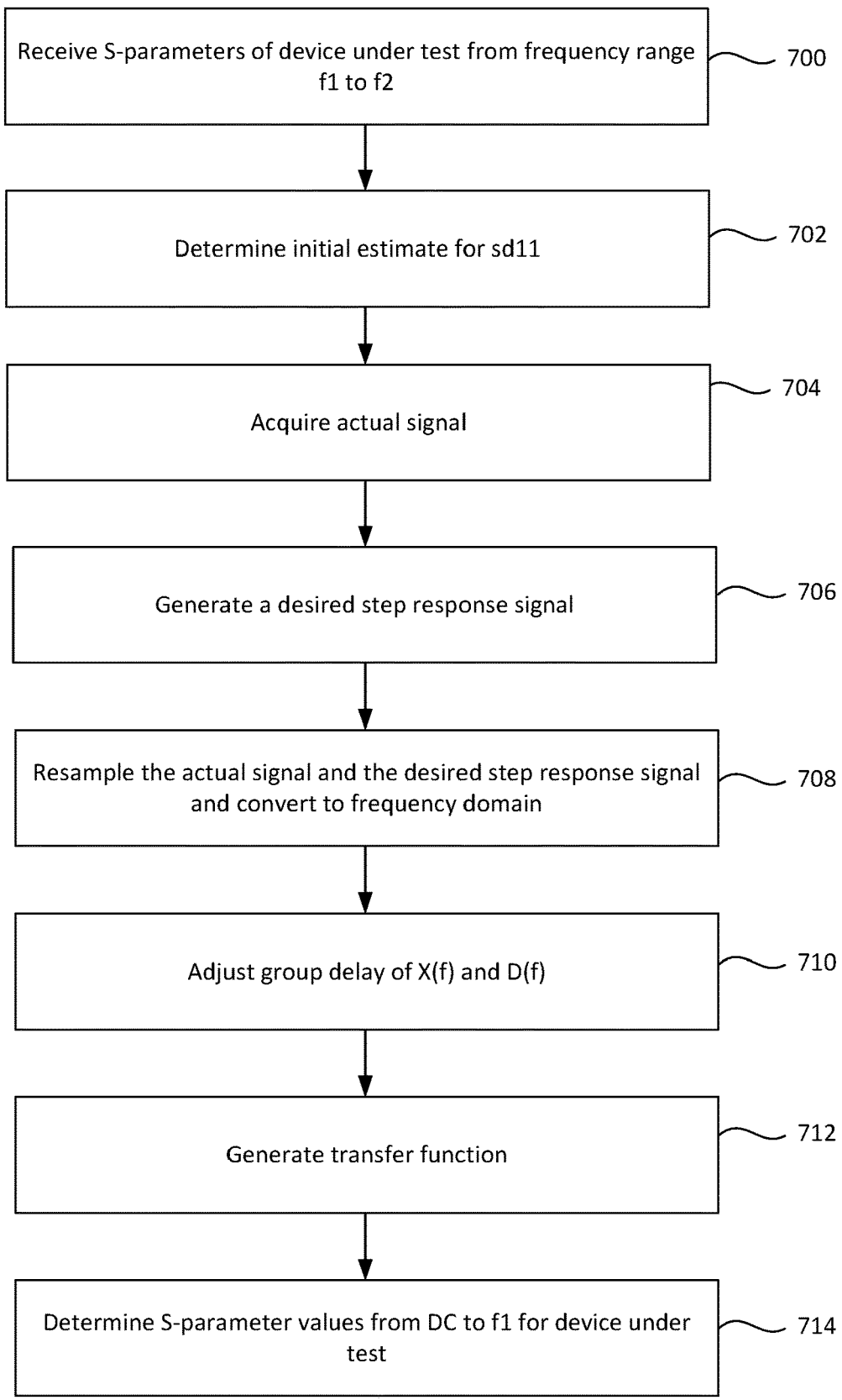
FIG. 7 is a flow chart illustrating an example operation for determining scattering parameters for a device under test in a low frequency range according to embodiments of the disclosure.

FIG. 7 illustrates a flow chart for determining the S-parameters of a device under test for a low frequency range according to embodiments of the disclosure. In operation 700, the S-parameters over the frequency range of f1 to f2, with f1 being greater than zero, are either determined using known methods or are otherwise received.

In operation 702, an initial estimate for s11 and s22 can be generated or determined based on an equivalent circuit model and a Smith chart to create an initial estimate for the probe tip s11. As mentioned above in equations 27 and 28, both s11 and s22 are equal to sd11. Therefore, these initial values of s11 and s22 can be used as the initial starting values for sd11.

An actual signal can be acquired in operation 704. This can be done with a large number of averages on the oscilloscope using the test and measurement system 400 in FIG. 4. A differential step generator 402 can be connected through the fixture 200 to the two input ports 102 and 104 of the device under test 100. The device under test 100 can be operated in a differential mode and a differential waveform, x(t), is acquired by the test and measurement instrument 404.

In operation 706, a desired step response signal, d(t), to represent the waveform at the tip of the device under test 100 is generated. The desired step response signal can be generated either assuming the device under test 100 has been de-embedded or may include all the fixture effects. However, in some embodiments, since the waveform frequency points at low frequency are relatively close to ideal at the device under test position, an ideal desired response can be used.

In operation 708, the desired step response d(t) and the actual step response x(t) can be resampled to match the record length and sample rate represented by the measured S-parameters in operation 700 and can be transformed to the frequency domain, D(f) and X(f), using equations (6) and (7) above.

In operation 710, the group delay of converted actual signal X(f) and the converted desired signal D(f) are adjusted to match the group delay with respect to the S-parameters of the device under test 100. To do this, first the group delay of each variable is computed by taking the negative derivative of the unwrapped phase of each variable. A group delay of D(f) is adjusted to make it zero. This is because the reference point of the device under test S-parameters is at zero time at the beginning of the time record. Therefore, the desired signal step must be at this time position with respect to the device under test S-parameter data. The group delay of X(f) is adjusted to make it equal to the group delay of the differential sd21 of the device under test 100.

In operation 712, a processor, such as processor 406 or another remote processor, can generate a system transfer function to solve for differential sd21 and sd11, such as the transfer function of question (4). However, embodiments of the disclosure are not limited to the transfer function as illustrated in equation (4). More complex transfer functions can be implemented that include more of the S-parameters of the device under test and/or can include more detail of the test fixture 200 effects.

In operation 714, S-parameter values for sd21 and sd11 are iteratively determined and then converted into single ended values using equations (19)-(28). Then the single ended values can be stored in a memory of a device under test 100, such as the memory 107 shown in FIG. 1, to be used during operation of the device.

Figure 8:
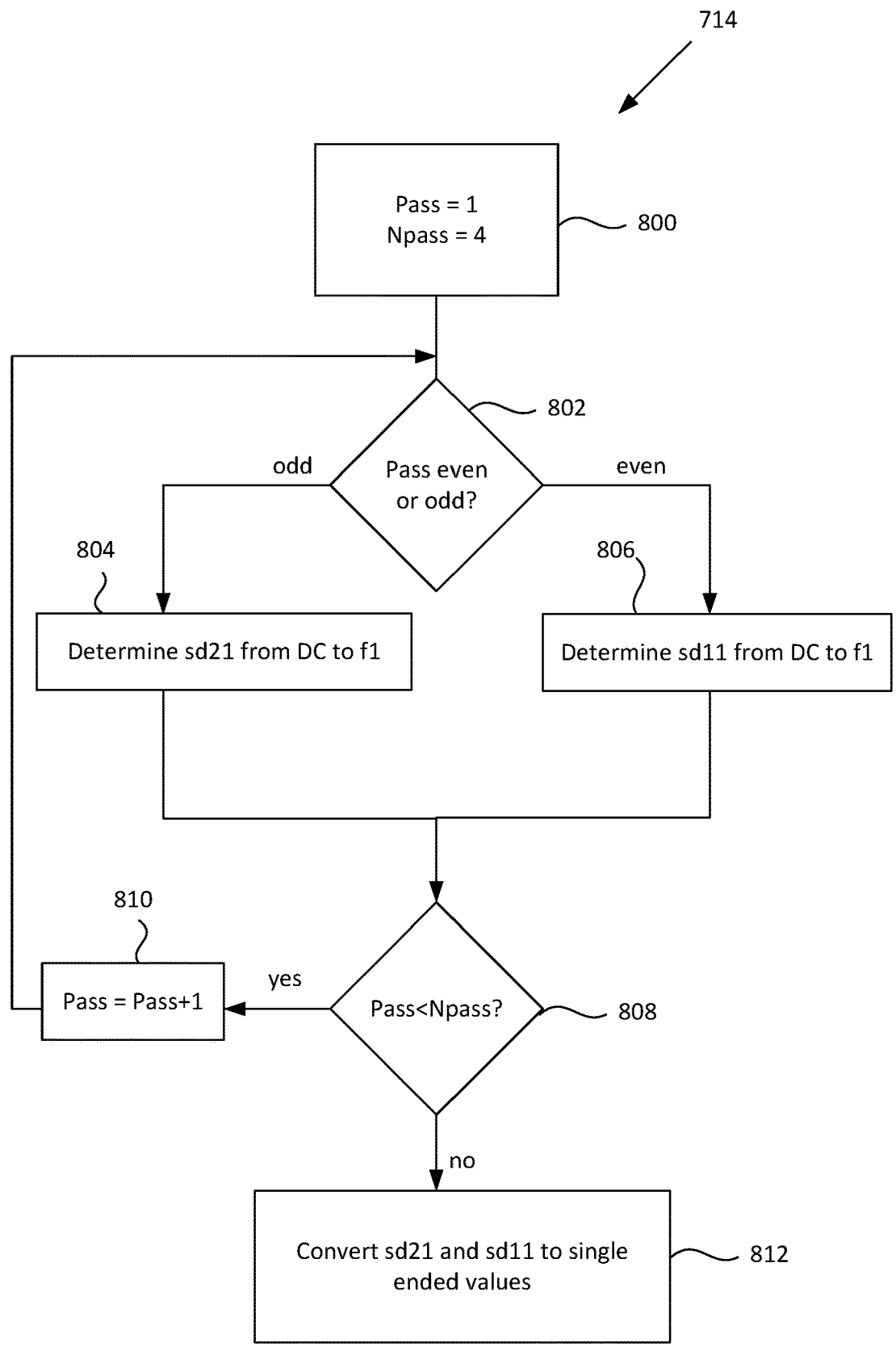
FIG. 8 is a flow chart further illustrating example operations for determining scattering parameters for a device under test in a low frequency range according to embodiments of the disclosure.

FIG. 8 illustrates operation 714 in further detail according to some embodiments of the disclosure. S-parameters sd21 and sd11 are iteratively determined until either a predetermined number of passes have elapsed, as illustrated in FIG. 8, or until the transfer function in equation (4) is within a predetermined tolerance of zero.

In operation 800 the number of passes is set. In FIG. 8, the number of passes is set to four, but any number of passes may be used. The number of passes may be set by a user or predetermined. In operation 802, it is determined whether the pass is even or odd. If the pass is odd, then in operation 804 sd21 is determined using equation (17) to solve for the values of sd21 from DC to f1. During the first pass, the value of sd11 is the initial estimate from operation 702. In subsequent passes, the value of sd11 is the value determined in operation 806 during the previous pass.

If the pass is even, then in operation 806, sd11 is determined using the last determined value of sd21 in operation 804 and equation (18) from DC to f1. In operation 808, the system determines whether the pass number is less than the total number of passes for the system set in operation 800. If yes, the value of the pass in incremented by one in operation 810, and the system returns to operation 802.

If the pass is equal to the total number of passes, then in operation 812, the determined values of sd21 and sd11 are converted into single-ended values of s32, s31, s11, and s22 for the device under test 100 S-parameter model from DC to f1. These values can be stored in a memory of the device under test 100, such as the memory 107 shown in FIG. 1, along with the S-parameters measured from f1 to f2, to be used during operation of the device under test 100 to perform accurate measurements.

Aspects of the disclosure may operate on particularly created hardware, firmware, digital signal processors, or on a specially programmed computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a computer readable storage medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or computer-readable storage media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

EXAMPLES

Illustrative examples of the technologies disclosed herein are provided below. An embodiment of the technologies may include any one or more, and any combination of, the examples described below.

Example 1 is a method for determining scattering parameters, S-parameters, for a device under test for a first frequency range, comprising receiving S-parameters for the device under test for a second frequency range, the second frequency range is greater than the first frequency range; measuring an actual signal of the device under test; determining a desired signal of the device under test; and determining the S-parameters for the device under test for the first frequency range based on the S-parameters for the second frequency range, the actual signal of the device under test, and the desired signal of the device under test.

Example 2 is the method of example 1, further comprising determining a starting value for a first S-parameter for the first frequency range based on the received S-parameters for the second frequency range; and determining the S-parameters for the device under test for the first frequency range based on the starting value.

Example 3 is the method of example 2, wherein determining the S-parameters for the device under test for the first frequency range includes iteratively determining for a number of passes the first S-parameter and a second S-parameter for the first frequency range until a predetermined number of passes are completed.

Example 4 is the method of example 3, wherein during a first pass the second S-parameter is determined using the starting value for the first S-parameter, during each subsequent even numbered pass the first S-parameter is determined using an updated second S-parameter that was determined during the previous odd numbered pass, and during each subsequent odd number pass the second S-parameter is determined using an updated first S-parameter that was determined during the previous even numbered pass.

Example 5 is the method of any one of examples 1 to 4, wherein determining the S-parameters for the device under test for the first frequency range includes determining differential S-parameters for the device under test for the first frequency range and converting the differential S-parameters to single ended S-parameters.

Example 6 is the method of any one of examples 1 to 5, further comprising resampling each of the actual signal and the desired signal to match a record length; and converting the resampled actual signal and the resampled desired signal to a frequency domain.

Example 7 is the method of example 6, further comprising adjusting a group delay of the converted resampled actual signal and the converted resampled desired signal to match a group delay of the device under test.

Example 8 is the method of any one of examples 1 to 7, further comprising storing the S-parameters for the device under test for the first frequency range in a memory of the device under test.

Example 9 is the method of any one of examples 1 to 8, wherein the first frequency range is between zero hertz and 25 megahertz.

Example 10 is a test and measurement system, comprising a step generator configured to generate a step signal; a test and measurement instrument configured to measure an actual response of a device under test based on the step signal; and one or more processors configured to determine a desired signal of the device under test, and determine scattering parameters, S-parameters, for a device under test for a first frequency range based on received S-parameters for the device under test for a second frequency range greater than the first frequency range, the actual response of the device under test, and the desired signal of the device under test.

Example 11 is the test and measurement system of example 10, wherein the one or more processors are further configured to determine a starting value for a first S-parameter for the first frequency range based on the received S-parameters for the second frequency range; and determine the S-parameters for the device under test for the first frequency range based on the starting value.

Example 12 is the test and measurement system of example 11, wherein determining the S-parameters for the device under test for the first frequency range includes iteratively determining the first S-parameter and a second S-parameter for the first frequency range until a predetermined threshold is met.

Example 13 is the test and measurement system of example 12, wherein during a first iteration the second S-parameter is determined using the starting value for the first S-parameter, during each subsequent even numbered iteration the first S-parameter is determined using an updated second S-parameter that was determined during the previous odd numbered iteration, and during each subsequent odd number iteration the second S-parameter is determined using an updated first S-parameter that was determined during the previous even numbered iteration.

Example 14 is the test and measurement system of example 10 to 13, wherein determining the S-parameters for the device under test for the first frequency range includes determining differential S-parameters for the device under test for the first frequency range and converting the differential S-parameters to single ended S-parameters.

Example 15 is the test and measurement system of any one of examples 10 to 14, wherein the one or more processors are further configured to resample each of the actual response and the desired signal to match a record length; and convert the resampled actual response and the resampled desired signal to a frequency domain.

Example 16 is the test and measurement system of example 15, wherein the one or more processors are further configured to adjust a group delay of converted resampled actual response and the converted resampled desired signal to match a group delay of the device under test.

Example 17 is the test and measurement system of any one of examples 10 to 16, wherein the device under test is a high impedance active probe.

Example 18 is the test and measurement system of any one of examples 10 to 17, wherein the first frequency range is between zero hertz and 25 megahertz.

Example 19 is one or more computer-readable storage media comprising instructions, which, when executed by one or more processors of a test and measurement instrument, cause the test and measurement instrument to measure an actual step response signal of the device under test; determine a desired step response signal of the device under test; and determine scattering parameters, S-parameters, for the device under test for a first frequency range based on received S-parameters for the device under test for a second frequency range, the second frequency range greater than the first frequency range, the actual step response signal of the device under test and the desired step response signal of the device under test.

Example 20 is the one or more computer-readable storage media of example 19, wherein the instructions further cause the test and measurement instrument to determine a starting value for a first S-parameter for the first frequency range based on the received S-parameters for the second frequency range; and determine the S-parameters for the device under test for the first frequency range based on the starting value.

The previously described versions of the disclosed subject matter have many advantages that were either described or would be apparent to a person of ordinary skill. Even so, these advantages or features are not required in all versions of the disclosed apparatus, systems, or methods.

Additionally, this written description makes reference to particular features. It is to be understood that the disclosure in this specification includes all possible combinations of those particular features. Where a particular feature is disclosed in the context of a particular aspect or example, that feature can also be used, to the extent possible, in the context of other aspects and examples.

Also, when reference is made in this application to a method having two or more defined steps or operations, the defined steps or operations can be carried out in any order or simultaneously, unless the context excludes those possibilities.

Although specific examples of the invention have been illustrated and described for purposes of illustration, it will be understood that various modifications may be made without departing from the spirit and scope of the invention. Accordingly, the invention should not be limited except as by the appended claims.

We claim:

1. A method for determining, by one or more processors, scattering parameters, S-parameters, for a device under test for a first frequency range, comprising:
  receiving S-parameters for the device under test for a second frequency range, where the second frequency range is from a frequency f1 up to a frequency f2, where f1 is greater than zero, and the first frequency range is from a frequency greater than or equal to zero frequency, DC, up to the frequency f1;
  measuring an actual signal of the device under test;
  determining a desired signal of the device under test; and
  determining the S-parameters for the device under test for the first frequency range based on the S-parameters for the second frequency range, the actual signal of the device under test, and the desired signal of the device under test.

2. The method of claim 1, further comprising:
  determining a starting value for a first S-parameter for the first frequency range based on the received S-parameters for the second frequency range; and
  determining the S-parameters for the device under test for the first frequency range based on the starting value.

3. The method of claim 2, wherein determining the S-parameters for the device under test for the first frequency range includes iteratively determining for a number of passes the first S-parameter and a second S-parameter for the first frequency range until a predetermined number of passes are completed.

4. The method of claim 3, wherein during a first pass the second S-parameter is determined using the starting value for the first S-parameter, during each subsequent even numbered pass the first S-parameter is determined using an updated second S-parameter that was determined during the previous odd numbered pass, and during each subsequent odd number pass the second S-parameter is determined using an updated first S-parameter that was determined during the previous even numbered pass.

5. The method of claim 1, wherein determining the S-parameters for the device under test for the first frequency range includes determining differential S-parameters for the device under test for the first frequency range and converting the differential S-parameters to single ended S-parameters.

6. The method of claim 1, further comprising:
  resampling each of the actual signal and the desired signal to match a record length; and
  converting the resampled actual signal and the resampled desired signal to a frequency domain.

7. The method of claim 6, further comprising adjusting a group delay of the converted resampled actual signal and the converted resampled desired signal to match a group delay of the device under test.

8. The method of claim 1, further comprising storing the S-parameters for the device under test for the first frequency range in a memory of the device under test.

9. The method of claim 1, wherein the frequency f1 is 25 megahertz, and the first frequency range is between zero hertz and 25 megahertz.

10. A test and measurement system, comprising:
  a step generator configured to generate a step signal as input to a device under test;
  a test and measurement instrument configured to measure an actual response of the device under test based on the step signal; and
  one or more processors configured to:
    receive the actual response of the device under test from the test and measurement instrument,
    determine a desired signal of the device under test, and
    determine scattering parameters, S-parameters, for the device under test for a first frequency range based on received S-parameters for the device under test for a second frequency range, the actual response of the device under test, and the desired signal of the device under test, where the second frequency range is from a frequency f1 up to a frequency f2, where f1 is greater than zero, and the first frequency range is from a frequency greater than or equal to zero frequency, DC, up to the frequency f1.

11. The test and measurement system of claim 10, wherein the one or more processors are further configured to:
  determine a starting value for a first S-parameter for the first frequency range based on the received scatter parameters for the second frequency range; and
  determine the S-parameters for the device under test for the first frequency range based on the starting value.

12. The test and measurement system of claim 11, wherein determining the S-parameters for the device under test for the first frequency range includes iteratively determining the first S-parameter and a second S-parameter for the first frequency range until a predetermined threshold is met.

13. The test and measurement system of claim 12, wherein during a first iteration the second S-parameter is determined using the starting value for the first S-parameter, during each subsequent even numbered iteration the first S-parameter is determined using an updated second S-parameter that was determined during the previous odd numbered iteration, and during each subsequent odd number iteration the second S-parameter is determined using an updated first S-parameter that was determined during the previous even numbered iteration.

14. The test and measurement system of claim 10, wherein determining the S-parameters for the device under test for the first frequency range includes determining differential S-parameters for the device under test for the first frequency range and converting the differential S-parameters to single ended S-parameters.

15. The test and measurement system of claim 10, wherein the one or more processors are further configured to:
  resample each of the actual response and the desired signal to match a record length; and
  convert the resampled actual response and the resampled desired signal to a frequency domain.

16. The test and measurement system of claim 15, further comprising adjusting a group delay of the converted resampled actual response and the converted resampled desired signal to match a group delay of the device under test.

17. The test and measurement system of claim 10, wherein the device under test is a high impedance active probe.

18. The test and measurement system of claim 10, wherein the frequency f1 is 25 megahertz and the first frequency range is between zero hertz and 25 megahertz.

19. One or more computer-readable storage media comprising instructions, which, when executed by one or more processors of a test and measurement instrument, cause the test and measurement instrument to:

measure an actual step response signal of a device under test;

determine a desired step response signal of the device under test; and determine scattering parameters, S-parameters, for the device under test for a first frequency range based on received S-parameters for the device under test for a second frequency range, the actual step response signal of the device under test and the desired step response signal of the device under test, where the second frequency range is from a frequency f1 up to a frequency f2, where f1 is greater than zero, and the first frequency range is from a frequency greater than or equal to zero frequency, DC, up to the frequency f1.

20. The one or more computer-readable storage media of claim 19, wherein the instructions further cause the test and measurement instrument to:

determine a starting value for a first S-parameter for the first frequency range based on the received S-parameters for the second frequency range; and determine the S-parameters for the device under test for the first frequency range based on the starting value.

* * * * *